United States Patent
Arevalo et al.

(10) Patent No.: US 7,642,150 B2
(45) Date of Patent: Jan. 5, 2010

(54) TECHNIQUES FOR FORMING SHALLOW JUNCTIONS

(75) Inventors: Edwin A. Arevalo, Haverhill, MA (US); Christopher R. Hatem, Cambridge, MA (US); Anthony Renau, West Newbury, MA (US); Jonathan Gerald England, Horsham (GB)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 126 days.

(21) Appl. No.: 11/733,467

(22) Filed: Apr. 10, 2007

(65) Prior Publication Data
US 2008/0108208 A1 May 8, 2008

Related U.S. Application Data

(60) Provisional application No. 60/857,954, filed on Nov. 8, 2006.

(51) Int. Cl.
*H01L 21/425* (2006.01)
*G21K 5/10* (2006.01)

(52) U.S. Cl. .................. 438/215; 438/514; 250/492.21

(58) Field of Classification Search ................ 438/514, 438/232, 510, 515, 766, 796, 798; 427/523, 427/526, 527, 529, 528, 530; 250/492.21
See application file for complete search history.

(56) References Cited

U.S. PATENT DOCUMENTS

| | | | |
|---|---|---|---|
| 5,158,897 A * | 10/1992 | Sato et al. ................... | 438/515 |
| 5,223,445 A | 6/1993 | Fuse | |
| 5,244,820 A | 9/1993 | Kamata et al. | |
| 5,624,598 A | 4/1997 | Shepodd et al. | |
| 5,763,319 A | 6/1998 | Ling et al. | |
| 5,863,831 A | 1/1999 | Ling et al. | |
| 5,965,482 A | 10/1999 | Heung et al. | |
| 6,013,332 A | 1/2000 | Goto et al. | |
| 6,109,207 A | 8/2000 | Ling et al. | |
| 6,365,492 B1 | 4/2002 | Suguro et al. | |
| 6,583,018 B1 * | 6/2003 | Matsunaga et al. .......... | 438/373 |

(Continued)

FOREIGN PATENT DOCUMENTS

EP 0581369 A1 2/1994

(Continued)

OTHER PUBLICATIONS

H. Graoui and M. A. Foad, "A comparative study on ultra-shallow junction formation using co-implantation with fluorine or carbon in pre-amorphized silicon", (2005), Materials Science and Engineering, vol. B124-125, pp. 188-191.*

(Continued)

*Primary Examiner*—Thomas L Dickey
*Assistant Examiner*—Nikolay Yushin

(57) ABSTRACT

Techniques for forming shallow junctions are disclosed. In one particular exemplary embodiment, the techniques may be realized as a method for forming shallow junctions. The method may comprise generating an ion beam comprising molecular ions based on one or more materials selected from a group consisting of: digermane ($Ge_2H_6$), germanium nitride ($Ge_3N_4$), germanium-fluorine compounds ($GF_n$, wherein n=1, 2, or 3), and other germanium-containing compounds. The method may also comprise causing the ion beam to impact a semiconductor wafer.

29 Claims, 4 Drawing Sheets

U.S. PATENT DOCUMENTS

| | | | |
|---|---|---|---|
| 6,743,738 B2 * | 6/2004 | Todd | 438/778 |
| 6,984,366 B2 * | 1/2006 | Syvret et al. | 423/406 |
| 2003/0038246 A1 | 2/2003 | Reyes et al. | |
| 2005/0181621 A1 | 8/2005 | Borland et al. | |
| 2005/0277246 A1 * | 12/2005 | Kirkpatrick et al. | 438/232 |
| 2006/0019477 A1 | 1/2006 | Hanawa et al. | |
| 2006/0148143 A1 | 7/2006 | Bedell et al. | |
| 2008/0044938 A1 * | 2/2008 | England et al. | 438/51 |

FOREIGN PATENT DOCUMENTS

| WO | 2007027798 A | 3/2007 |
|---|---|---|

OTHER PUBLICATIONS

A.C. Ajmera and G.A. Rozgonyi, "Elimination of end-of-range and mask edge lateral damage in Ge+ preamorphized, B+ implanted Si", (1996), Apllied Phys. Lett., vol. 49,, No. 19, pp. 1269-1271.*

S.M. Sze, Semiconductor Devices. Physics and Technology, Second Edition (2002), John Willey & Sons, Inc., p. 481.*

Graoui et al., "A comparative study on ultra-shallow junction formation using co-implantation with fluorine or carbon in pre-amorphized silicon", 2005, Materials Science and Engineering, vol. B 124-125, pp. 188-191.*

Sze, "Semiconductor Device. Physics and Technology", 2002, p. 481.*

Ajmera et al. , "Elimination of end-of-range and mask edge lateral damage in Ge+ preamorphized, B+ implanted Si", 1986, Appl. Phys. Lett., vol. 49 (19), pp. 1269-1271.*

Uddin, M.N., et al.: "B-C-N Hybrid Synthesis by High-Temperature Ion Implantation," Applied Surface Science, Elsevier, Amsterdam, NL, vol. 241, No. 1-2, Feb. 28, 2005, pp. 246-249.

Chu, P.K.: "Plasma Doping: Theoretical Simulation and Use of Safer Gas," Junction Technology, 2000, The First International Workshop On, Extended Abstracts of Dec. 6, 2000, Piscataway, NJ, USA, IEEE, 2000, pp. 35-40.

Leung, K.N., et al.: "RF Driven Multicusp Ion Source for Pulsed or Steady-State Ion Beam Production," Nuclear Instruments & Methods in Physics Research, Section—B: Beam Interactions with Materials and Atoms, Elsevier, Amsterdam, NL, vol. B74, No. 1/2, Apr. 2, 1993, pp. 291-294.

Draganic, I., et al.: "Production of Multiply Charged Ion Beams From Solid Substances With the mVINIS Ion Source," Review of Scientific Instruments, American Institute of Physics, US, vol. 77, No. 3, Mar. 9, 2006, pp. 3A306-3A306.

Kovisto, H., et al., The First Results With the New JYFL 14 GHz ECR Ion Source; Nuclear Instruments & Methods in Physics Research, Section B: Beam Interactions with Materials and Atoms; Elsevier, Amsterdam, NL, vol. 174, No. 3, Apr. 2001, pp. 379-384.

SemEquip, Inc., ClusterCarbon™ Implant Material, 2006.

Wade Krull, et al., "Simplifying the 45nm SDE Process with ClusterBoron® and ClusterCarbon™ Implantation", Ion Implantation Technology, American Institute of Physics, p. 182-185, 2006.

Graoui, et al.: "A Comparative Study on Ultra-Shallow Junction Formation Using Co-Implantation with Fluorine or Carbon in Pre-Amorphized Silicon;" Materials Science and Engineering B, Elsevier Sequoia, Lausanne, CH, vol. 124-125; Dec. 5, 2005; pp. 188-191.

* cited by examiner

TECHNIQUES FOR FORMING SHALLOW JUNCTIONS

CROSS-REFERENCE TO RELATED APPLICATIONS

This patent application claims priority to U.S. Provisional Patent Application No. 60/857,954, filed Nov. 8, 2006, which is hereby incorporated by reference herein in its entirety.

This patent application is related to U.S. patent application Ser. No. 11/342,183, filed Jan. 26, 2006, which is hereby incorporated by reference herein in its entirety.

FIELD OF THE DISCLOSURE

The present disclosure relates generally to semiconductor manufacturing and, more particularly, to techniques for forming shallow junctions.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energies.

FIG. 1 depicts a traditional ion implanter system 100 in which a technique for low-temperature ion implantation may be implemented in accordance with an embodiment of the present disclosure. As is typical for most ion implanter systems, the system 100 is housed in a high-vacuum environment. The ion implanter system 100 may comprise an ion source 102, biased to a potential by power supply 101, and a complex series of beam-line components through which an ion beam 10 passes. The series of beam-line components may include, for example, extraction electrodes 104, a 90° magnet analyzer 106, a first deceleration (D1) stage 108, a 70° magnet collimator 110, and a second deceleration (D2) stage 112. Much like a series of optical lenses that manipulate a light beam, the beam-line components can filter and focus the ion beam 10 before steering it towards a target wafer. During ion implantation, the target wafer is typically mounted on a platen 114 that can be moved in one or more dimensions (e.g., translate, rotate, and tilt) by an apparatus, sometimes referred to as a "roplat."

With continued miniaturization of semiconductor devices, there has been an increased demand for ultra-shallow junctions. For example, tremendous effort has been devoted to creating better activated, shallower, and more abrupt source-drain extension junctions to meet the needs of modern complementary metal-oxide-semiconductor (CMOS) devices.

To create an abrupt, ultra-shallow junction in a crystalline silicon wafer, for example, an amorphization of the wafer surface may be desirable. Generally, a relatively thick amorphous silicon layer may be preferred since a thin amorphous layer may allow more significant channeling, and so a deeper as-implanted dopant atoms depth distribution and more post-implant damage residing in an end-of-range area beyond the amorphous-crystalline interface. As a result, a thinner amorphous layer may lead to a deeper junction depth, a less abrupt doping profile, an inadequate activation of dopants, and more end-of-range defects after anneal, all of which represent major obstacles in modern CMOS device miniaturization, especially for source-drain extension doping. Amorphization of a silicon wafer can be achieved with a pre-amorphization implant (PAI) process. So far, silicon, germanium, or inert gas atomic ions and some exotic molecular ion species have been used in PAI processes.

To further ensure the formation of a shallow yet abrupt junction, a low-thermal-budget anneal is often performed as a preferred post-implant process wherein the temperature of a wafer is ramped up to a high level in a very short time (e.g., to 1000° C. within 5 seconds). A laser or a flash lamp may also be employed for the post-implant anneal. However, the diffusion-less anneal alone may not be enough to prevent all the ion-implanted dopants from diffusing deeper into the wafer. A process known as transient enhanced diffusion (TED), which is driven by excess silicon interstitials created during dopant implantation, can cause a significant amount of certain dopants (e.g., boron, phosphorous) to diffuse further into the wafer. It is possible for the diffusion coefficient of the ion-implanted dopants to increase temporarily by orders of magnitude until the implant damage has been annealed out. It has been discovered that certain species such as carbon (C) and fluorine (F) may reduce the TED effect by reducing the interaction between interstitials and dopant atoms. One existing approach employs a cluster implantation process to place carbon into silicon wafers in order to reduce the TED effect. However, this approach requires not only proprietary cluster implantation equipment, but also exotic, proprietary hydrocarbon molecules as feed materials. Another approach uses atomic species as co-implant materials.

In view of the foregoing, it would be desirable to provide techniques for forming shallow junctions which overcomes the above-described inadequacies and shortcomings.

SUMMARY OF THE DISCLOSURE

Techniques for forming shallow junctions are disclosed. In one particular exemplary embodiment, the techniques may be realized as a method for forming shallow junctions. The method may comprise generating an ion beam comprising molecular ions based on one or more materials selected from a group consisting of: digermane ($Ge_2H_6$), germanium nitride ($Ge_3N_4$), germanium-fluorine compounds ($GF_n$, wherein n=1, 2, or 3), and other germanium-containing compounds. The method may also comprise causing the ion beam to impact a semiconductor wafer to amorphize at least one portion of the semiconductor wafer prior to ion implantation of dopants into the semiconductor wafer.

In accordance with other aspects of this particular exemplary embodiment, the method may further comprise the steps of performing a first ion implantation on the semiconductor wafer to incorporate the dopants into the amorphized portion of the semiconductor wafer, and performing a second ion implantation on the semiconductor wafer to place one or more co-implant species in the semiconductor wafer, the one or more co-implant species being implanted with molecular ions based on one or more materials selected from a group consisting of CF, $CF_2$, $Z_nC_xF_y$, and $C_xH_yZ_n$ wherein Z represents one or more atomic species other than carbon or hydrogen.

In accordance with further aspects of this particular exemplary embodiment, the method may further comprise the steps of performing a first ion implantation on the semiconductor wafer to place one or more co-implant species in the semiconductor wafer, the one or more co-implant species being implanted with molecular ions based on one or more materials selected from a group consisting of CF, $CF_2$, $Z_nC_xF_y$, and $C_xH_yZ_n$, wherein Z represents one or more atomic species other than carbon or hydrogen, and performing a second ion implantation on the semiconductor wafer to incorporate the dopants into the amorphized portion of the semiconductor wafer.

In accordance with additional aspects of this particular exemplary embodiment, the method may further comprise performing ion implantation on the semiconductor wafer to incorporate the dopants into the amorphized portion of the semiconductor wafer, wherein, at least at the beginning of the ion implantation, a temperature of the semiconductor wafer is substantially lower than room temperature. The temperature of the semiconductor wafer may be lower than zero degree Celsius. The semiconductor wafer may be pre-chilled to a desired temperature prior to the ion implantation. Alternatively, the temperature of the semiconductor wafer may be maintained at a desired temperature during at least a portion of the ion implantation.

In another particular exemplary embodiment, the techniques may be realized as a method for forming shallow junctions. The method may comprise generating an ion beam comprising molecular ions based on one or more materials selected from a group consisting of $Z_nC_xF_y$ and $C_xH_yZ_n$, wherein Z represents one or more atomic species other than carbon or hydrogen. The method may also comprise causing the ion beam to impact a semiconductor wafer to amorphize at least one portion of the semiconductor wafer prior to ion implantation of dopants into the semiconductor wafer.

In accordance with other aspects of this particular exemplary embodiment, the impact by the ion beam may further cause one or more co-implant species selected from a group consisting of carbon and fluorine to be placed in one or more predetermined locations in the semiconductor wafer.

In accordance with further aspects of this particular exemplary embodiment, the method may further comprise performing a low-temperature ion implantation on the semiconductor wafer to incorporate dopants into the amorphized portion of the semiconductor wafer.

In yet another particular exemplary embodiment, the techniques may be realized as an apparatus for forming shallow junctions. The apparatus may comprise an ion source assembly to generate an ion beam comprising molecular ions based on one or more materials selected from a group consisting of: digermane ($Ge_2H_6$), germanium nitride ($Ge_3N_4$), germanium-fluorine compounds ($GF_n$, wherein n=1, 2, or 3), and other germanium-containing compounds. The apparatus may also comprise one or more beam-line components to cause the ion beam to impact a semiconductor wafer to amorphize at least one portion of the semiconductor wafer prior to ion implantation of dopants into the semiconductor wafer.

In accordance with other aspects of this particular exemplary embodiment, the apparatus may be further configured to perform a low-temperature ion implantation on the semiconductor wafer to incorporate dopants into the amorphized portion of the semiconductor wafer.

In still another particular exemplary embodiment, the techniques may be realized as an apparatus for forming shallow junctions. The apparatus may comprise an ion source assembly to generate an ion beam comprising molecular ions based on one or more materials selected from a group consisting of $Z_nC_xF_y$ and $C_xH_yZ_n$, wherein Z represents one or more atomic species other than carbon or hydrogen. The apparatus may also comprise one or more beam-line components to cause the ion beam to impact a semiconductor wafer to amorphize at least one portion of the semiconductor wafer prior to ion implantation of dopants into the semiconductor wafer.

In accordance with other aspects of this particular exemplary embodiment, the impact by the ion beam may further cause one or more co-implant species selected from a group consisting of carbon and fluorine to be placed in one or more predetermined locations in the semiconductor wafer.

In accordance with further aspects of this particular exemplary embodiment, the apparatus may be further configured to perform a low-temperature ion implantation on the semiconductor wafer to incorporate dopants into the amorphized portion of the semiconductor wafer.

In a further particular exemplary embodiment, the techniques may be realized as a method for forming shallow junctions. The method may comprise generating an ion beam comprising molecular ions based on one or more carbon- or fluorine-containing molecules that are selected from a group consisting of: CF, $CF_2$, $Z_nC_xF_y$ and $C_xH_yZ_n$, wherein x, y and n are each positive integers, and wherein Z represents one or more atomic species other than carbon, fluorine or hydrogen. The method may also comprise causing the ion beam to impact a semiconductor wafer to place one or more co-implant species selected from a group consisting of carbon and fluorine at predetermined locations in the semiconductor wafer.

In accordance with other aspects of this particular exemplary embodiment, the method may further comprise performing a low-temperature ion implantation on the semiconductor wafer to incorporate dopants into the semiconductor wafer.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure may reduce undesired migration of ion-implanted dopants through one or more auxiliary ion implantation processes. Prior to dopant implantation, a pre-amorphization implantation (PAI) may be performed on a target wafer with a molecular ion beam generated from one or more germanium-containing molecules. In addition to the dopant implantation, carbon- or fluorine-containing molecular ions may be co-implanted to place carbon or fluorine species into desired portions of the target wafer to mitigate TED effects. In some embodiments, the PAI and co-implant steps may be merged into one if a suitable molecular ion species is employed.

The techniques disclosed herein are not limited to beamline ion implanters, but are also applicable to other types of ion implanters such as those used for plasma doping (PLAD) or plasma immersion ion implantation (PIII).

Figure 1:
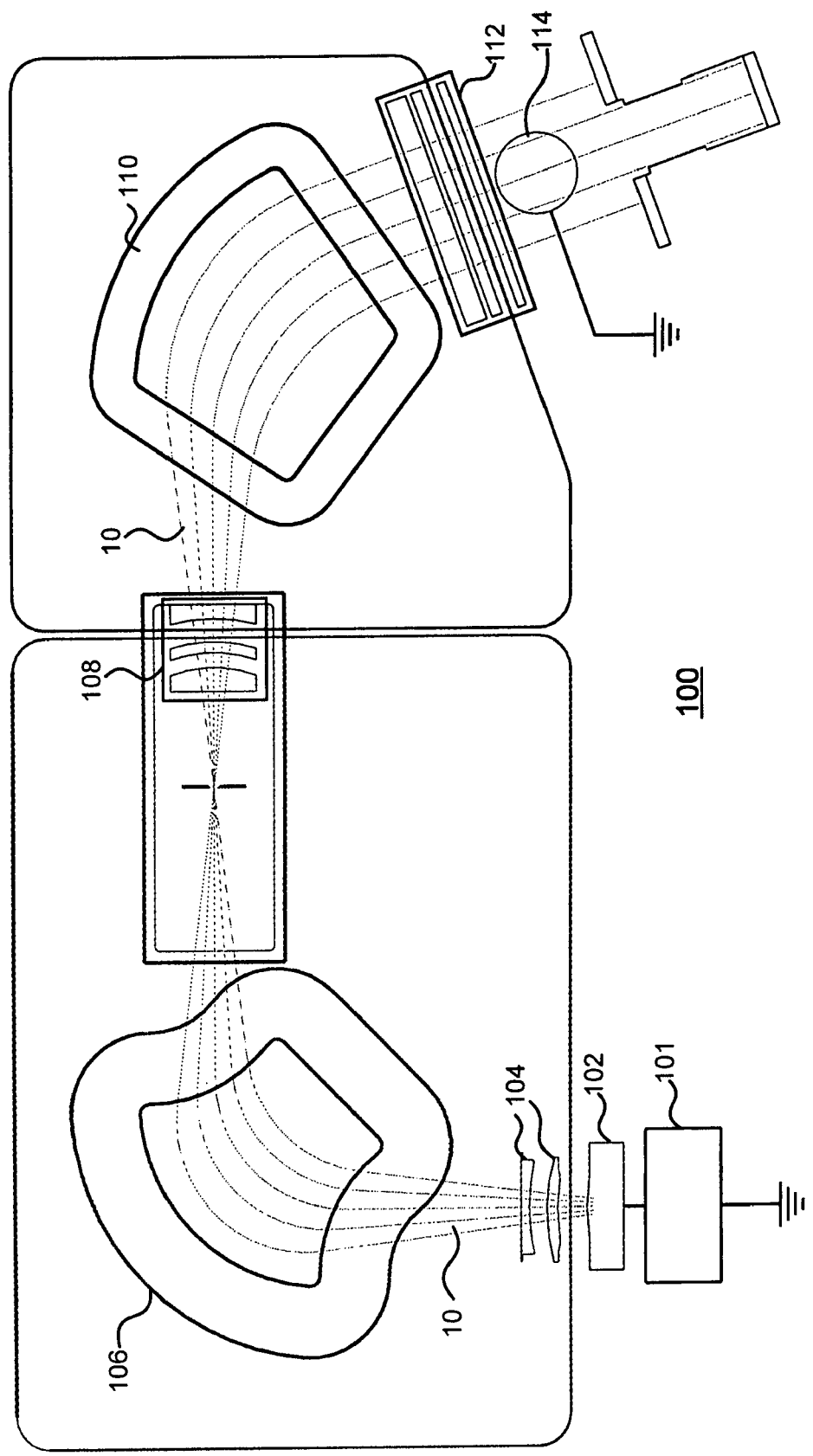
FIG. 1 shows a traditional ion implanter system.
Figure 2:
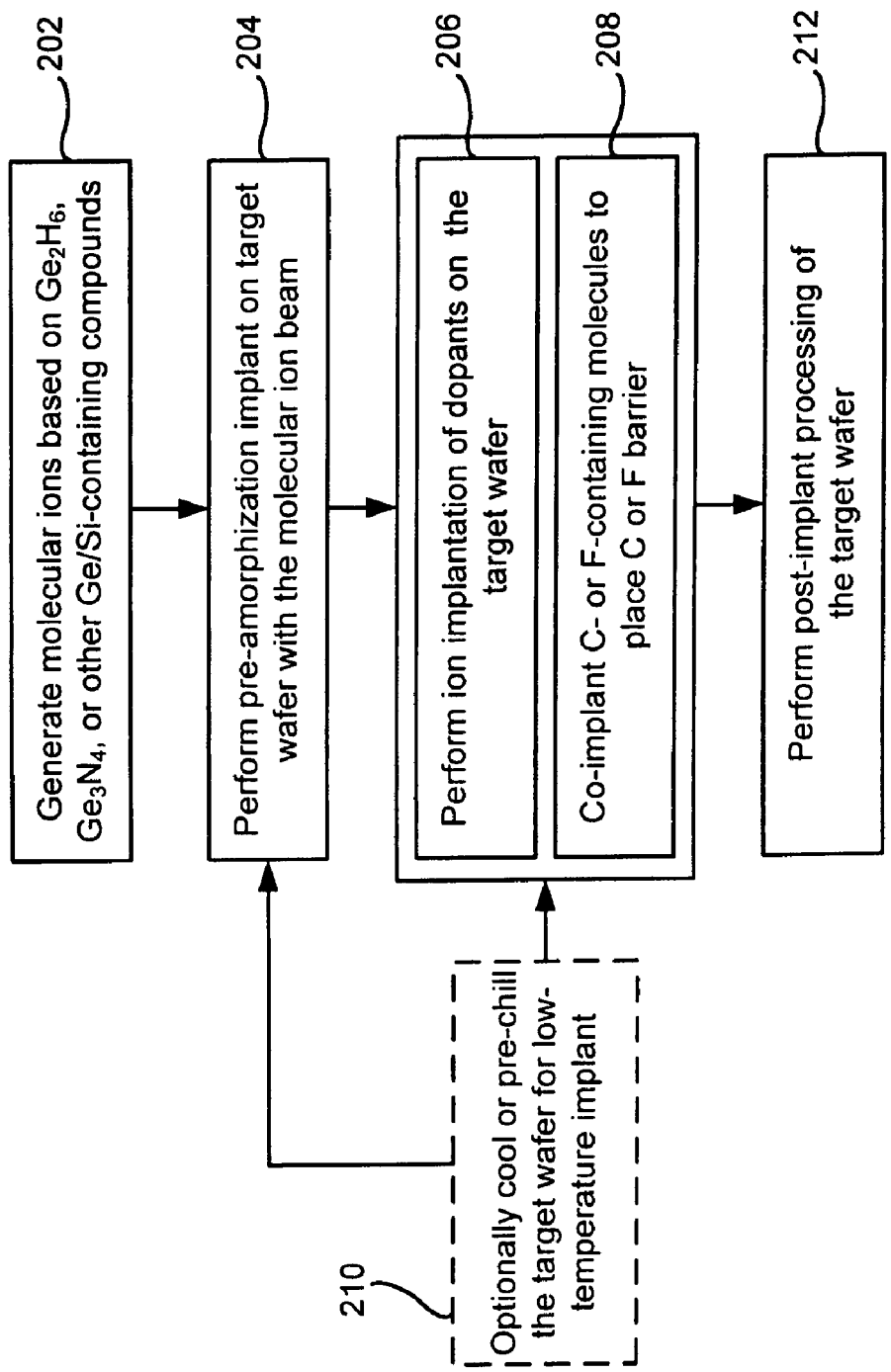
FIG. 2 shows a flow chart illustrating an exemplary method of forming shallow junctions in accordance with an embodiment of the present disclosure.

Referring to FIG. 2, there is shown a flow chart illustrating an exemplary method of forming shallow junctions in accordance with an embodiment of the present disclosure.

In step 202, molecular ions may be generated based on digermane ($Ge_2H_6$), germanium nitride ($Ge_3N_4$), or other similar germanium- and/or silicon-containing compounds. The generation of these molecular ions may take place in an indirectly-heated cathode (IHC) ion source or another type of ion source. The molecular ions may then be extracted to form a molecular ion beam. $Ge_2H_6$ and/or $Ge_3N_4$ may be preferred over the commonly used germanium fluoride ($GeF_4$) because the latter tends to cause ion source maintenance problems or shorten the ion source lifetime.

In step 204, a pre-amorphization implant (PAI) may be performed on a target wafer (e.g., a crystalline silicon wafer) with the molecular ion beam which contains germanium or silicon species. The energy and dose of the molecular ion beam may be controlled such that a portion of the target wafer will be amorphized. The amorphized portion may extend from a surface of the target wafer to a predetermined depth. The PAI step breaks up crystalline structure in the amorphized portion of the target wafer, thereby reducing channeling of ion-implanted dopants. The PAI step may also be used to control a damage profile in the target wafer which in turn may influence post-implant diffusion, dopant activation, and other aspects of final device performance such as leakage current. PAI with a molecular ion beam may be advantageous over PAI with an atomic ion beam due to higher productivity (as a result of either higher effective beam currents or fewer processing steps), faster damage accumulation, and other process advantages.

In step 206, ion implantation may be performed to incorporate dopant species into the target wafer. The dopant implantation may involve one or more dopant species and different recipes (i.e., energy, dose, angle). The dopants are typically implanted into the amorphized portion of the target wafer.

Optionally, in step 210, the target wafer may be cooled or pre-chilled to accommodate a low-temperature implant of the dopants. For example, a temperature management system may be implemented to keep the target wafer substantially below room temperature during the dopant implantation. Alternatively or additionally, the target wafer and/or its platen may be pre-chilled to a low temperature prior to the start of the dopant implantation.

In step 208, carbon- or fluorine-containing molecules may be co-implanted to place carbon or fluorine ("co-implant species") into the target wafer. Preferably, these co-implant species are located near an end-of-range (EOR) region to form a barrier between the EOR damage and dopant atoms. The co-implanted co-implant species may thus help prevent TED effects from driving dopants deeper into the target wafer.

The carbon- or fluorine-containing co-implant species may include but are not limited to: $CF$, $CF_2$, $Z_nC_xF_y$, and $C_xH_yZ_n$, wherein x, y and n are each positive integers. Here, Z may represent a single atom or a group of atoms (such as N, Si, $NH_4$). Examples of $C_xH_yZ_n$ may include $C_9H_{14}Si$ and $C_7H_{17}N$. Z may be chosen because it has a benefit to the overall ion implantation process, or because it has no effect on the process. If Z causes any impairment to the process, it may still be chosen if the impairment can be offset by other advantages. One criterion for choosing a particular Z element/composition may be to improve ion beam generation, such as allowing operation in standard ion sources rather than requiring a specialized source.

By implanting separately from the dopant species, the profile of the co-implant species may be optimized. For example, a carborane ($C_2B_{10}H_{12}$) implant (with a boron equivalent energy of 500 eV) has a very similar as-implanted carbon profile to the boron profile. Further reductions in post-anneal boron profile may be achieved if a second carbon implant of higher energy (for example 6 keV) is carried out to place carbon between boron dopants and EOR damage from the PAI step.

According to other embodiments, it may be advantageous to select a feed material molecule that contains both a co-implant species and a desired dopant species. For example, in feed materials $Z_nC_xF_y$ or $C_xH_yZ_n$, if the Z atom or atom group is chosen to contain a dopant atom such as boron (B), the co-implant step will also cause the dopant atoms to be simultaneously implanted, thereby possibly reducing a dopant implant step.

It should be noted that step 206 does not have to precede step 208. The co-implant step (208) may occur either concurrently with or precede the dopant implantation step (206) or not happen at all.

In step 212, post-implant processing of the target wafer may be performed. The post-implant processing typically involves a rapid thermal anneal or a pulsed laser anneal. The post-implant anneal may repair the crystal damages caused by the PAI step and at the same time activate the ion-implanted dopants.

Figure 3:
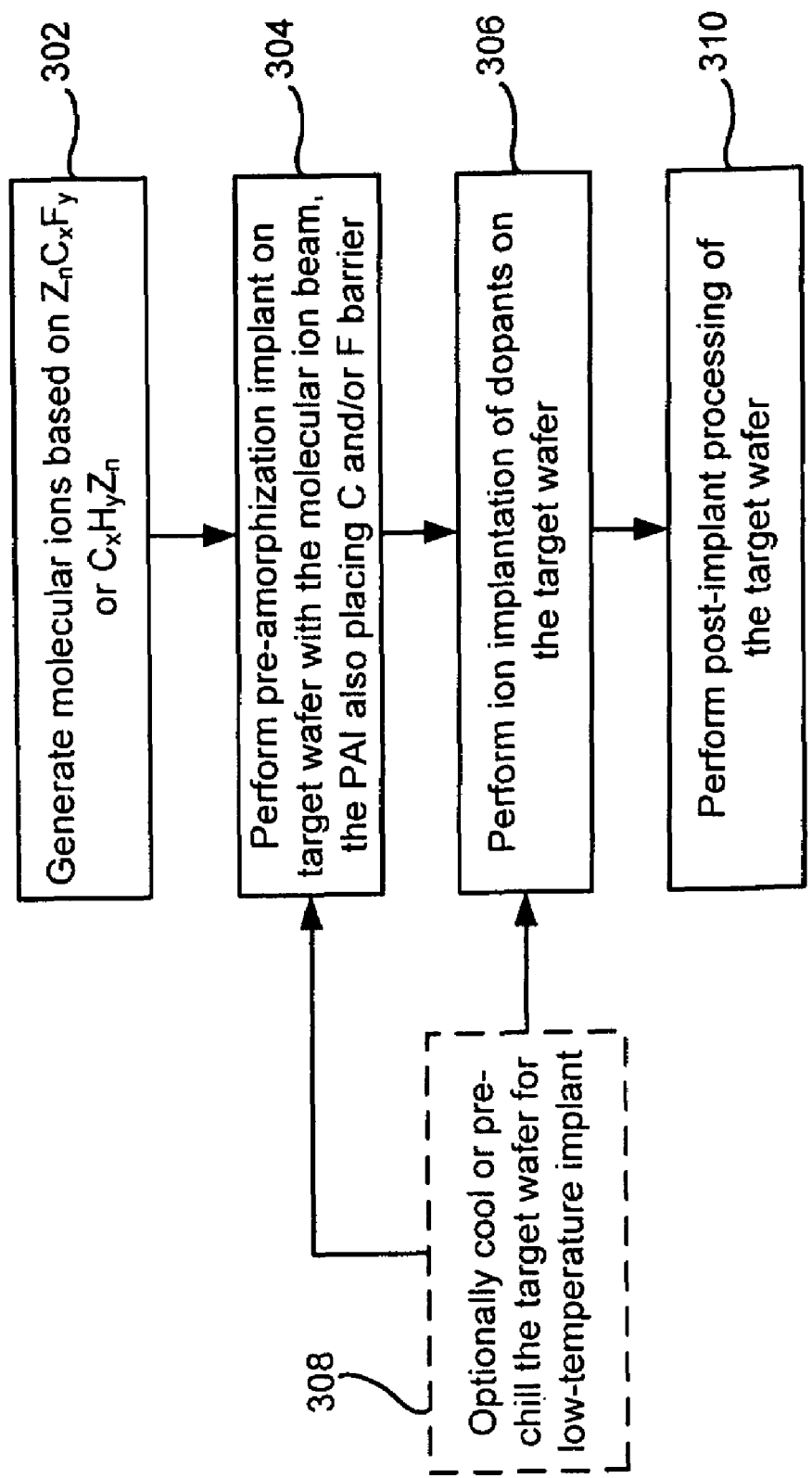
FIG. 3 shows a flow chart illustrating another exemplary method of forming shallow junctions in accordance with an embodiment of the present disclosure.

FIG. 3 shows a flow chart illustrating another exemplary method of forming shallow junctions in accordance with an embodiment of the present disclosure.

In step 302, molecular ions may be generated based on $Z_nC_xF_y$, $C_xH_yZ_n$, or other similar molecules, wherein x, y and n are each positive integers. The feed materials $Z_nC_xF_y$ or $C_xH_yZ_n$, may be chosen to have sufficient molecular weight and contain at least one of carbon or fluorine species. The generation of these molecular ions may take place preferably in a conventional ion source such as an IHC ion source, although other types of ion sources may also be used. One example of $C_xH_yZ_n$ is carborane ($C_2B_{10}H_{12}$). The molecular ions may then be extracted to form a molecular ion beam.

In step 304, a pre-amorphization implant (PAI) may be performed on a target wafer (e.g., a crystalline silicon wafer) with the molecular ion beam. The energy and dose of the molecular ion beam may be controlled such that a portion of the target wafer will be amorphized. In addition, the molecular ion beam may at the same time cause carbon or fluorine species ("co-implant species") to be placed in the target wafer in order to mitigate TED effects. That is, the PAI step and the co-implant step are effectively combined into one step (304). Alternatively, the PAI process may be carried out in two or more steps with different doses, energies, and/or angles of the molecular ion beam, such that a desired profile of co-implant species may be achieved.

In step 306, ion implantation may be performed to incorporate dopant species into the target wafer. The dopant implantation may involve one or more dopant species and different recipes (i.e., energy, dose, angle). The dopants are typically implanted into the amorphized portion of the target wafer. Optionally, in step 308, the target wafer may be cooled or pre-chilled to accommodate a low-temperature implant of the dopants.

Finally, in step 310, post-implant processing of the target wafer may be performed to repair damages to the crystal lattice and to activate the dopants.

Figure 4:
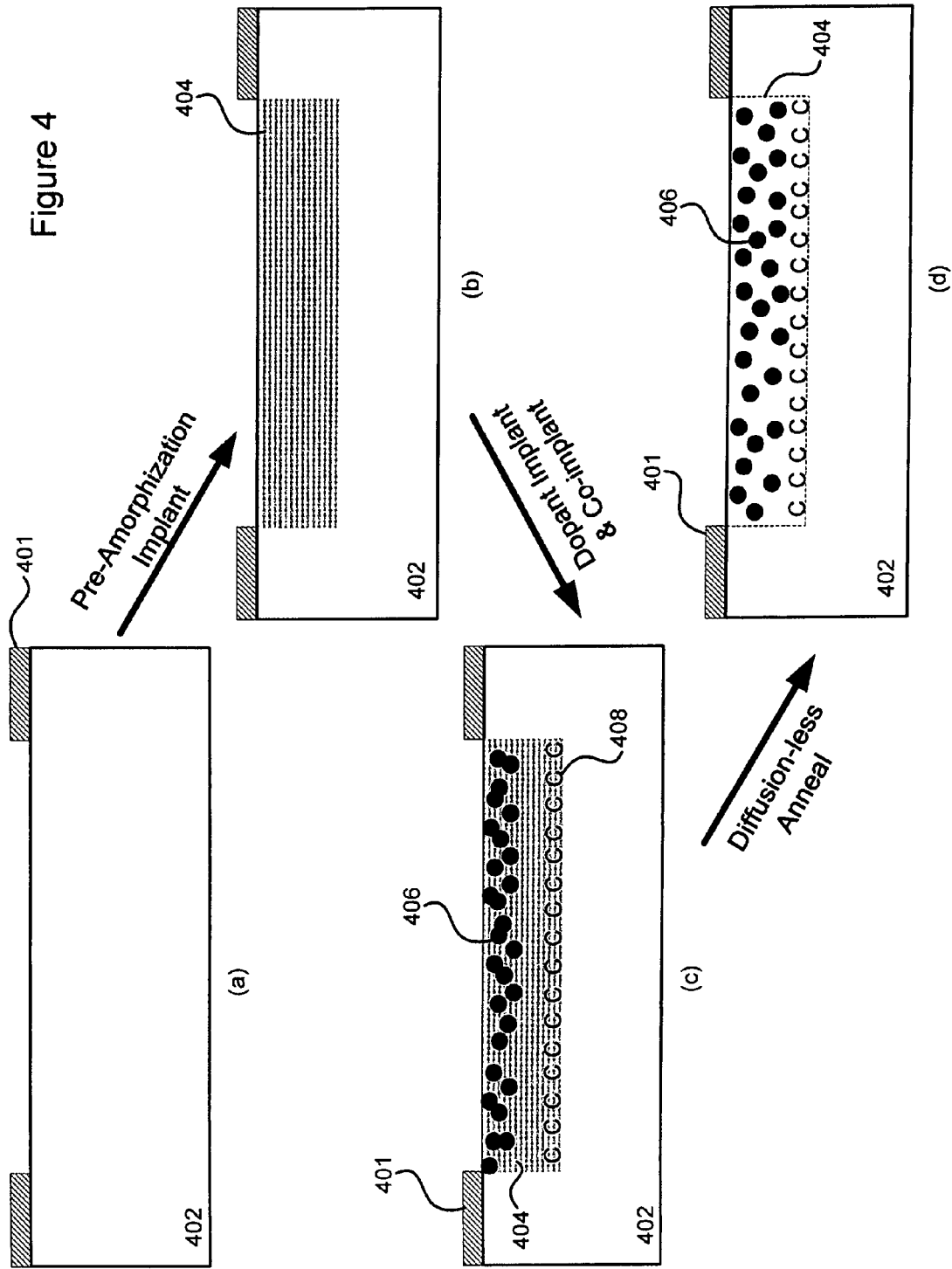
FIG. 4 shows a portion of a silicon wafer as it undergoes exemplary processing steps in accordance with an embodiment of the present disclosure.

FIG. 4 shows a portion of a silicon wafer 402 as it undergoes exemplary processing steps in accordance with an embodiment of the present disclosure. FIG. 4(*a*) shows the silicon wafer 402 prior to any ion implantation where the silicon crystal lattice may be intact. The silicon wafer 402 is masked with a layer of patterned photoresist 401 to shield those areas that do not need doping. FIG. 4(*b*) shows the silicon wafer 402 after a pre-amorphization implant (PAI), for example, by a molecular ion beam containing silicon, germanium or other molecular compounds as described above. As a result of the PAI step, a portion of the silicon wafer 402 may have become amorphized, creating an amorphous silicon region 404. FIG. 4(*c*) shows the silicon wafer 402 after it has further undergone a dopant implant step and a carbon co-implant step. As shown, the dopant implant step, which may be based on either an atomic ion beam or a molecular ion beam, has incorporated dopants 406 into the amorphous silicon region 404. In addition, the carbon co-implant step, which may be based on the carbon-containing co-implant species as described above, has placed carbon species 408 near the boundary between the amorphous silicon region 404 and the underlying crystalline silicon region of the silicon wafer 402. FIG. 4(*d*) shows the silicon wafer 402 after it is subject to a post-implant diffusion-less anneal step. The diffusion-less anneal step has restored the amorphous silicon region 404 back to a crystalline state. The dopants 406 may become activated and diffuse. The co-implanted carbon species 408 may help confine the dopants 406 to a shallow surface region (404).

According to embodiments of the present disclosure, many hydrocarbon species ($C_nH_m$, wherein n and m are positive integers) may be suitable for either PAI or co-implant processes (or a PAI-plus-co-implant combination process) as described above. So far, some exotic, proprietary hydrocarbon molecules, produced from an electron-impact type ion source, have been used as feed materials for low-energy carbon implant. More preferably, however, desired hydrocarbon molecular ions ($C_nH_m$) may be generated in standard ion sources, such as IHC-type, Bernas-type, or Freeman-type ion sources. Alternatively, radio frequency (RF) or microwave powered ion sources may be used to generate the desired hydrocarbon molecular ions.

The techniques for forming shallow junctions as described herein may be advantageously combined with low-temperature ion implantation techniques. For example, a target wafer may be either pre-chilled or continuously cooled such that its temperature stays substantially below room temperature during any of the PAI, co-implant and dopant implant steps.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for forming shallow junctions, the method comprising the steps of:
   generating an ion beam comprising molecular ions based on $Z_nC_xF_y$, wherein Z represents one or more atomic species other than carbon or hydrogen; and
   causing the ion beam to impact a semiconductor wafer.

2. The method according to claim 1, wherein the impact of the ion beam causes at least one portion of the semiconductor wafer to be amorphized prior to ion implantation of dopants into the semiconductor wafer.

3. The method according to claim 2, wherein the impact of the ion beam further causes one or more co-implant species selected from a group consisting of carbon and fluorine to be placed in one or more predetermined locations in the semiconductor wafer.

4. The method according to claim 2, further comprising:
   performing a low-temperature ion implantation on the semiconductor wafer to incorporate dopants into the amorphized portion of the semiconductor wafer.

5. The method according to claim 1, wherein the impact of the ion beam causes one or more co-implant species to be placed into the semiconductor wafer.

6. The method according to claim 5, wherein the one or more co-implant species are selected from a group consisting of carbon and fluorine.

7. The method according to claim 6, wherein the one or more co-implant species are placed in an end-of range area within the semiconductor wafer.

8. The method according to claim 1, wherein, during the impact of the ion beam, the semiconductor wafer is in a temperature range substantially lower than room temperature.

9. A method for forming shallow junctions, the method comprising the steps of:
   generating an ion beam comprising molecular ions based on one or more materials selected from a group consisting of: germanium nitride ($Ge_3N_4$) and germanium-fluorine compounds ($GeF_n$, wherein n=1, 2, or 3); and
   causing the ion beam to impact a semiconductor wafer.

10. The method according to claim 1, wherein the impact of the ion beam causes at least one portion of the semiconductor wafer to be amorphized prior to ion implantation of dopants into the semiconductor wafer.

11. The method according to claim 1, further comprising:
    performing a first ion implantation on the semiconductor wafer to incorporate dopants into the semiconductor wafer; and
    performing a second ion implantation on the semiconductor wafer to place one or more co-implant species in the semiconductor wafer, the one or more co-implant species being implanted with molecular ions based on one or more materials selected from a group consisting of $CF$, $CF_2$, $Z_nC_xF_y$, and $C_xH_yZ_n$, wherein Z represents one or more atomic species other than carbon or hydrogen.

12. The method according to claim 1, further comprising:
    performing a first ion implantation on the semiconductor wafer to place one or more co-implant species in the semiconductor wafer, the one or more co-implant species being implanted with molecular ions based on one or more materials selected from a group consisting of CF, $CF_2$, $Z_nC_xF_y$, and $C_xH_yZ_n$, wherein Z represents one or more atomic species other than carbon or hydrogen; and performing a second ion implantation on the semiconductor wafer to incorporate dopants into the semiconductor wafer.

13. The method according to claim 1, further comprising: performing ion implantation on the semiconductor wafer to incorporate dopants into the semiconductor wafer, wherein, at least at the beginning of the ion implantation, a temperature of the semiconductor wafer is substantially lower than room temperature.

14. The method according to claim 13, wherein the temperature of the semiconductor wafer is lower than zero degree Celsius.

15. The method according to claim 13, wherein the temperature of the semiconductor wafer is pre-chilled to a desired temperature prior to the ion implantation.

16. The method according to claim 13, wherein the semiconductor wafer is maintained in a desired temperature range during at least a portion of the ion implantation.

17. The method according to claim 1, wherein, during the impact of the ion beam, the semiconductor wafer is in a temperature range substantially lower than room temperature.

18. An apparatus for forming shallow junctions, the apparatus comprising:

an ion source assembly to generate an ion beam comprising molecular ions based on one or more materials selected from a group consisting of: germanium nitride ($Ge_3N_4$) and germanium-fluorine compounds ($GeF_n$, wherein n=1, 2, or 3); and one or more components to cause the ion beam to impact a semiconductor wafer.

19. The apparatus according to claim 18, wherein the impact of the ion beam causes at least one portion of the semiconductor wafer to be amorphized prior to ion implantation of dopants into the semiconductor wafer.

20. The apparatus according to claim 18, being further configured to maintain the semiconductor wafer in a temperature range substantially lower than room temperature during the impact of the ion beam.

21. The apparatus according to claim 18, being further configured to perform a low-temperature ion implantation on the semiconductor wafer to incorporate dopants into an amorphized portion of the semiconductor wafer.

22. An apparatus for forming shallow junctions, the apparatus comprising:

an ion source assembly to generate an ion beam comprising molecular ions based on $Z_nC_xF_y$, wherein Z represents one or more atomic species other than carbon or hydrogen; and one or more components to cause the ion beam to impact a semiconductor wafer.

23. The apparatus according to claim 22, wherein the impact of the ion beam further causes one or more co-implant species selected from a group consisting of carbon and fluorine to be placed in one or more predetermined locations in the semiconductor wafer.

24. The apparatus according to claim 22, wherein the impact of the ion beam causes one or more co-implant species to be placed into the semiconductor wafer.

25. The apparatus according to claim 24, wherein the one or more co-implant species are selected from a group consisting of carbon and fluorine.

26. The apparatus according to claim 25, wherein the one or more co-implant species are placed in an end-of-range area within the semiconductor wafer.

27. The apparatus according to claim 22, wherein the impact of the ion beam causes at least one portion of the semiconductor wafer to be amorphized prior to ion implantation of dopants into the semiconductor wafer.

28. The apparatus according to claim 22, being further configured to maintain the semiconductor wafer in a temperature range substantially lower than room temperature during the impact of the ion beam.

29. The apparatus according to claim 22, being further configured to perform a low-temperature ion implantation on the semiconductor wafer to incorporate dopants into an amorphized portion of the semiconductor wafer.

* * * * *